(12) United States Patent
Sayyah et al.

(10) Patent No.: US 10,976,414 B2
(45) Date of Patent: Apr. 13, 2021

(54) HETEROGENEOUS INTEGRATION OF CURVED MIRROR STRUCTURE FOR PASSIVE ALIGNMENT IN CHIP-SCALE LIDAR

(71) Applicant: GM Global Technology Operations LLC, Detroit, MI (US)

(72) Inventors: Keyvan Sayyah, Santa Monica, CA (US); Oleg Efimov, Thousand Oaks, CA (US); Pamela Patterson, Los Angeles, CA (US); Raymond Sarkissian, Studio City, CA (US); James H. Schaffner, Chatsworth, CA (US); Biqin Huang, Torrance, CA (US); David Hammon, Simi Valley, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 421 days.

(21) Appl. No.: 16/018,730

(22) Filed: Jun. 26, 2018

(65) Prior Publication Data

US 2019/0018112 A1    Jan. 17, 2019

Related U.S. Application Data

(60) Provisional application No. 62/531,414, filed on Jul. 12, 2017.

(51) Int. Cl.
*G01S 7/48* (2006.01)
*G01S 7/481* (2006.01)
(Continued)

(52) U.S. Cl.
CPC .............. *G01S 7/4815* (2013.01); *B81B 7/02* (2013.01); *G01S 7/4816* (2013.01);
(Continued)

(58) Field of Classification Search
USPC ......................................................... 356/5.01
See application file for complete search history.

(56) References Cited

U.S. PATENT DOCUMENTS 4,394,060 A * 7/1983 Verber ............... G02B 6/12004
324/76.36
5,139,879 A 8/1992 Aharoni
(Continued)

OTHER PUBLICATIONS

Hobbs, Philip C. D. "Ultrasensitive laser measurements without tears", Applied Optics, vol. 36, No. 4, Feb. 1, 1997, pp. 903-920.
(Continued)

*Primary Examiner* — James R Hulka
(74) *Attorney, Agent, or Firm* — Cantor Colburn LLP

(57) ABSTRACT

A chip-scale coherent lidar system includes a photonic chip that includes a light source, a transmit beam coupler to provide an output signal, and a receive beam coupler to receive a received signal based on a reflection of the output signal by a target. The system also includes a transmit beam steering device to transmit the output signal out of the system, and a receive beam steering device to obtain the received signal into the system. A transmit beam curved mirror reflects the output signal from the transmit beam coupler to the transmit beam steering device. A receive beam curved mirror reflects the received signal from the receive beam steering device to the receive beam coupler. The transmit beam curved mirror and the receive beam curved mirror are formed in a substrate that is heterogeneously integrated with the photonic chip.

19 Claims, 4 Drawing Sheets

(51) Int. Cl.

| | |
|---|---|
| *G01S 7/4911* | (2020.01) |
| *G01S 17/58* | (2006.01) |
| *G01S 17/42* | (2006.01) |
| *G01S 17/34* | (2020.01) |
| *G01S 17/86* | (2020.01) |
| *G01S 17/931* | (2020.01) |
| *G01S 7/499* | (2006.01) |
| *G01S 17/02* | (2020.01) |
| *G02B 6/122* | (2006.01) |
| *G02B 6/27* | (2006.01) |
| *G02B 6/42* | (2006.01) |
| *H01L 23/544* | (2006.01) |
| *H01L 31/0232* | (2014.01) |
| *H01L 31/16* | (2006.01) |
| *G01S 17/00* | (2020.01) |
| *G01S 17/32* | (2020.01) |
| *G01S 7/4914* | (2020.01) |
| *G01S 7/491* | (2020.01) |
| *G01S 7/497* | (2006.01) |
| *B81B 7/02* | (2006.01) |
| *G02B 27/30* | (2006.01) |
| *H01S 5/125* | (2006.01) |
| *G01S 7/4913* | (2020.01) |
| *G02B 6/00* | (2006.01) |

(52) U.S. Cl.
CPC .......... *G01S 7/4817* (2013.01); *G01S 7/4818* (2013.01); *G01S 7/491* (2013.01); *G01S 7/499* (2013.01); *G01S 7/4911* (2013.01); *G01S 7/4913* (2013.01); *G01S 7/4914* (2013.01); *G01S 7/4972* (2013.01); *G01S 17/003* (2013.01); *G01S 17/02* (2013.01); *G01S 17/32* (2013.01); *G01S 17/34* (2020.01); *G01S 17/42* (2013.01); *G01S 17/58* (2013.01); *G01S 17/86* (2020.01); *G01S 17/931* (2020.01); *G02B 6/122* (2013.01); *G02B 6/2766* (2013.01); *G02B 6/4209* (2013.01); *G02B 27/30* (2013.01); *H01L 23/544* (2013.01); *H01L 31/02327* (2013.01); *H01L 31/16* (2013.01); *H01S 5/125* (2013.01); *B81B 2207/03* (2013.01); *G02B 2006/0098* (2013.01); *H01L 2223/54426* (2013.01); *H01L 2223/54486* (2013.01)

(56) References Cited

U.S. PATENT DOCUMENTS

| | | | |
|---|---|---|---|
| 5,283,846 A | 2/1994 | Toyonaka | |
| 5,499,132 A | 3/1996 | Tojo | |
| 5,835,199 A * | 11/1998 | Phillips | G01S 7/4802 356/5.03 |
| 5,852,492 A * | 12/1998 | Nimblett | G01S 7/51 356/5.04 |
| 6,122,110 A | 11/2000 | Park | |
| 6,229,947 B1 | 5/2001 | Vawter | |
| 6,480,331 B1 | 11/2002 | Cao | |
| 6,839,170 B2 * | 1/2005 | Li | G02B 6/2746 359/484.04 |
| 6,962,345 B2 | 11/2005 | Inciong | |
| 7,031,574 B2 * | 4/2006 | Huang | G02B 6/2746 385/21 |
| 7,081,996 B2 * | 7/2006 | Wills | G02B 6/272 359/484.03 |
| 7,108,810 B2 | 9/2006 | Nakamura | |
| 7,359,593 B2 | 4/2008 | Little | |
| 7,481,588 B2 | 1/2009 | Monte | |
| 7,596,315 B2 * | 9/2009 | Nakashima | H04J 14/0246 398/34 |
| 8,116,602 B2 | 2/2012 | Little | |
| 8,121,450 B2 | 2/2012 | Webster | |
| 8,193,555 B2 * | 6/2012 | Lin | H01L 27/14621 257/99 |
| 8,878,095 B2 * | 11/2014 | Li | B23K 26/066 219/121.75 |
| 8,908,251 B2 * | 12/2014 | Sayyah | G01S 7/4817 359/254 |
| 9,122,037 B2 | 9/2015 | Shastri | |
| 9,310,471 B2 | 4/2016 | Sayyah | |
| 9,335,480 B1 | 5/2016 | Celo | |
| 9,575,162 B2 | 2/2017 | Owechko | |
| 9,720,218 B2 * | 8/2017 | Cui | G02B 21/367 |
| 9,733,544 B2 * | 8/2017 | Sayyah | H01L 31/02161 |
| 9,735,885 B1 * | 8/2017 | Sayyah | H01Q 15/0086 |
| 9,804,264 B2 * | 10/2017 | Villeneuve | G01S 17/931 |
| 9,823,118 B2 * | 11/2017 | Doylend | G01S 7/4813 |
| 10,288,805 B2 * | 5/2019 | Luff | G02B 6/1228 |
| 10,324,261 B2 * | 6/2019 | Leijtens | G02B 6/264 |
| 10,564,263 B2 * | 2/2020 | Efimov | G02B 6/122 |
| 10,591,600 B2 * | 3/2020 | Villeneuve | G01S 17/02 |
| 10,615,568 B2 * | 4/2020 | Sayyah | G02B 1/11 |
| 2001/0030807 A1 | 10/2001 | Ikari | |
| 2002/0012167 A1 | 1/2002 | Wills | |
| 2003/0077437 A1 * | 4/2003 | Nakamura | B82Y 20/00 428/327 |
| 2003/0155720 A1 * | 8/2003 | Inciong | F16J 15/0825 277/592 |
| 2004/0070827 A1 | 4/2004 | Li | |
| 2005/0018967 A1 | 1/2005 | Huang | |
| 2005/0213979 A1 | 9/2005 | Nakashima | |
| 2006/0002443 A1 | 1/2006 | Farber | |
| 2006/0285797 A1 * | 12/2006 | Little | G02B 6/1228 385/43 |
| 2008/0118208 A1 * | 5/2008 | Monte | G02B 6/25 385/96 |
| 2009/0096545 A1 * | 4/2009 | O'Hara | H01P 7/08 332/129 |
| 2009/0162013 A1 * | 6/2009 | Webster | G02B 6/32 385/39 |
| 2009/0262766 A1 * | 10/2009 | Chen | H03C 7/027 372/26 |
| 2010/0200898 A1 | 8/2010 | Lin | |
| 2010/0266288 A1 * | 10/2010 | Little | G02B 6/1228 398/139 |
| 2010/0301971 A1 * | 12/2010 | Yonak | H01P 7/082 333/219.1 |
| 2012/0152918 A1 | 6/2012 | Li | |
| 2013/0209033 A1 | 8/2013 | Luff | |
| 2014/0080729 A1 * | 3/2014 | Grego | G01N 33/54373 506/9 |
| 2014/0211298 A1 * | 7/2014 | Sayyah | G02F 1/29 359/298 |
| 2015/0023631 A1 * | 1/2015 | Shastri | G02B 6/46 385/14 |
| 2015/0042992 A1 | 2/2015 | Cui | |
| 2015/0062691 A1 * | 3/2015 | Sayyah | H01P 7/082 359/316 |
| 2015/0378011 A1 * | 12/2015 | Owechko | G01S 17/34 356/4.01 |
| 2015/0378012 A1 * | 12/2015 | Sayyah | G01S 17/34 356/4.01 |
| 2017/0153319 A1 | 6/2017 | Villeneuve | |
| 2017/0184450 A1 | 6/2017 | Doylend | |
| 2017/0336565 A1 | 11/2017 | Ryckman | |
| 2017/0370676 A1 | 12/2017 | Volfson | |
| 2018/0024299 A1 | 1/2018 | Leijtens | |
| 2019/0018110 A1 * | 1/2019 | Kremer | G01S 7/4914 |
| 2019/0018113 A1 * | 1/2019 | Sayyah | G01S 7/4816 |
| 2019/0018121 A1 * | 1/2019 | Sayyah | G01S 17/003 |

OTHER PUBLICATIONS

Schroedter et al., "Microcontroller based closed-loop control of a 2D quasi-static/resonant microscanner with on-chip piezo-resistive sensor feedback", Proc. Of SPIE, vol. 10116, 2017, pp. 1-12.

(56) References Cited

OTHER PUBLICATIONS

Winter et al., "Micro-beamer based on MEMS micro-mirrors and laser light source", Procedia Chemistry, vol. 1, Issue 1, 2009, pp. 1311-1314.

* cited by examiner

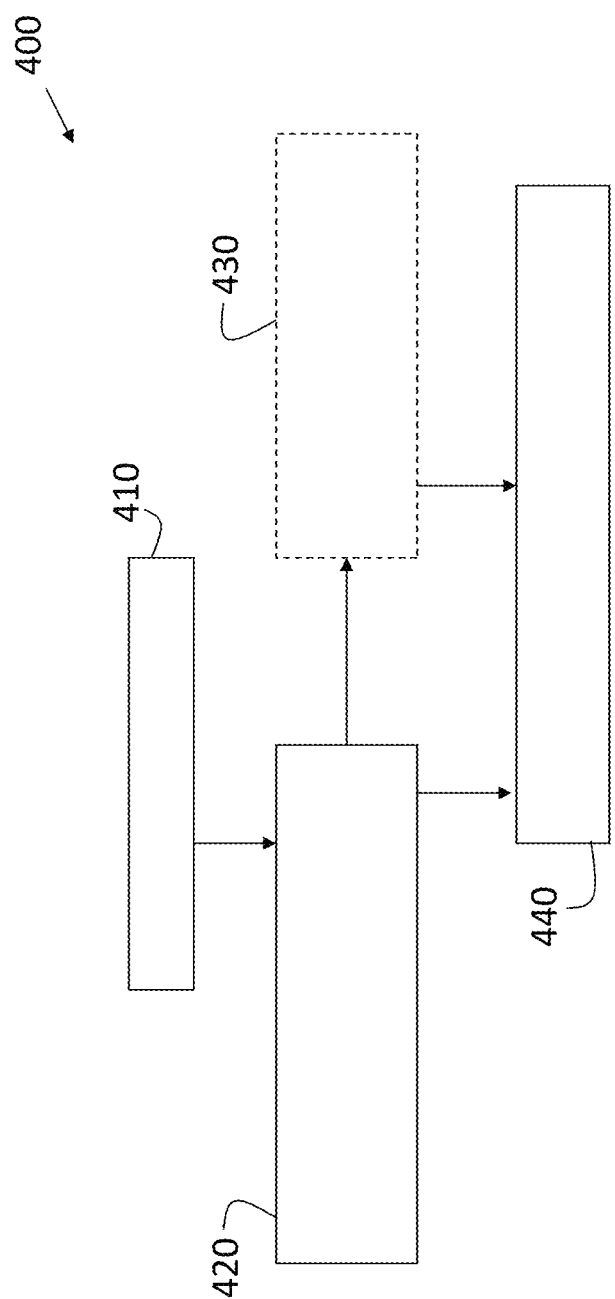

HETEROGENEOUS INTEGRATION OF CURVED MIRROR STRUCTURE FOR PASSIVE ALIGNMENT IN CHIP-SCALE LIDAR

CROSS-REFERENCE TO RELATED APPLICATIONS

This application claims the benefit of priority of U.S. Provisional Application No. 62/531,414 filed Jul. 12, 2017, the disclosure of which is incorporated herein by reference in its entirety.

INTRODUCTION

The subject disclosure relates to heterogeneous integration of a curved mirror structure for passive alignment in a chip-scale lidar.

Vehicles (e.g., automobiles, trucks, construction equipment, farm equipment, automated factory equipment) are increasingly outfitted with sensors that provide information to augment or automate vehicle operation. Exemplary sensors include radio detection and ranging (radar) systems, cameras, microphones, and light detection and ranging (lidar) systems. An exemplary lidar system is a coherent lidar system that transmits a frequency modulated continuous wave (FMCW) signal and relies on optical coherence between the transmitted signal and a return signal resulting from reflected scattering of the transmitted signal by a target to perform detection of the target. In an application, such as the vehicle application, in which reducing the size of various sensor and systems may be desirable, chip-scale lidar may be used. In a chip-scale lidar system, components such as the light source and photodetectors may be fabricated on an integrated circuit, referred to as a photonic chip. For effective operation of the lidar system, mirrors that collimate light and act as an intermediary between the light emitting and receiving elements on the photonic chip and scanning elements (i.e., beam steering devices) that ultimately transmit light and receive reflections must be properly aligned with both the elements on the photonic chip and the scanning elements. Accordingly, it is desirable to provide heterogeneous integration of a curved mirror structure for passive alignment in a chip-scale lidar.

SUMMARY

In one exemplary embodiment, a chip-scale coherent lidar system includes a photonic chip that includes a light source, a transmit beam coupler to provide an output signal, and a receive beam coupler to receive a received signal based on a reflection of the output signal by a target. The system also includes a transmit beam steering device to transmit the output signal out of the system, and a receive beam steering device to obtain the received signal into the system. A transmit beam curved mirror reflects the output signal from the transmit beam coupler to the transmit beam steering device, and a receive beam curved mirror reflects the received signal from the receive beam steering device to the receive beam coupler. The transmit beam curved mirror and the receive beam curved mirror are formed in a substrate that is heterogeneously integrated with the photonic chip.

In addition to one or more of the features described herein, the photonic chip includes alignment marks to facilitate passive alignment of the photonic chip with the substrate that includes the transmit beam curved mirror and the receive beam curved mirror.

In addition to one or more of the features described herein, the light source outputs a frequency modulated continuous wave as the output signal.

In addition to one or more of the features described herein, the photonic chip is formed on a packaging substrate.

In addition to one or more of the features described herein, the transmit beam steering device and the receive beam steering device are also formed on the packaging substrate.

In addition to one or more of the features described herein, the transmit beam steering device and the receive beam steering device are formed non-parallel to the photonic chip on the packaging substrate.

In addition to one or more of the features described herein, a center-to-center distance between the transmit beam curved mirror and the receive beam curved mirror is a same as a distance between the transmit beam coupler and the receive beam coupler on the photonic chip.

In addition to one or more of the features described herein, the transmit beam curved mirror is formed using lithographic techniques with a curvature configured to collimate the output signal from the transmit beam coupler, and the receive beam curved mirror is formed using lithographic techniques with a curvature configured to focus the received signal from the receive beam steering device onto the photonic chip coupler.

In addition to one or more of the features described herein, a second transmit beam curved mirror is stamped based on a mold formed from the transmit beam curved mirror, and a second receive beam curved mirror is stamped based on a mold formed from the receive beam curved mirror.

In addition to one or more of the features described herein, the lidar system is within or on a vehicle and detects a location and speed of an object relative to the vehicle.

In another exemplary embodiment, a method of assembling a coherent lidar system includes forming a transmit curved mirror and a receive curved mirror side-by-side in a substrate as a curved mirror structure. The method also includes forming a photonic chip on a packaging substrate, the photonic chip including a light source, a transmit beam coupler configured to provide an output signal, and a receive beam coupler to receive a received signal based on a reflection of the output signal by a target. The curved mirror structure is heterogeneously integrated with the photonic chip.

In addition to one or more of the features described herein, the method also includes disposing a transmit beam steering device and a receive beam steering device side-by-side on the packaging substrate.

In addition to one or more of the features described herein, the disposing the transmit beam steering device and the receive beam steering device includes separating the transmit beam steering device and the receive beam steering device by a same distance as a center-to-center distance between the transmit curved mirror and the receive curved mirror.

In addition to one or more of the features described herein, the disposing the transmit beam steering device and the receive beam steering device is on a non-parallel plane with the photonic chip.

In addition to one or more of the features described herein, the heterogeneously integrating the curved mirror structure with the photonic chip includes using alignment marks on the photonic chip to passively align the curved mirror structure with the photonic chip.

In addition to one or more of the features described herein, the forming the transmit curved mirror and the receive curved mirror includes using photolithography and etching.

In addition to one or more of the features described herein, the method also includes forming a second transmit curved mirror and a second receive curved mirror includes stamping the second transmit curved mirror and the second receive curved mirror using molds formed respectively from the transmit curved mirror and the receive curved mirror.

In yet another exemplary embodiment, a vehicle includes a coherent lidar system that includes a photonic chip that includes a light source, a transmit beam coupler to provide an output signal, and a receive beam coupler to receive a received signal based on a reflection of the output signal by a target and focusing it onto a receive beam coupler on the photonic chip. The system also includes a transmit beam steering device to transmit the output signal out of the system, and a receive beam steering device to obtain the received signal into the system. A transmit beam curved mirror reflects the output signal from the transmit beam coupler to the transmit beam steering device, and a receive beam curved mirror reflects the received signal from the receive beam steering device to the receive beam coupler. The transmit beam curved mirror and the receive beam curved mirror are formed in a substrate that is heterogeneously integrated with the photonic chip. The vehicle also includes a vehicle controller to use information from the lidar system to augment or automate vehicle systems.

In addition to one or more of the features described herein, the transmit beam steering device and the receive beam steering device are formed non-parallel to the photonic chip on the packaging substrate.

In addition to one or more of the features described herein, a center-to-center distance between the transmit beam curved mirror and the receive beam curved mirror is a same as a distance between the transmit beam coupler and the receive beam coupler on the photonic chip.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which:

FIG. 4 is a process flow of a method of assembling a lidar system with heterogeneously integrated curved mirrors according to one or more embodiments.

DETAILED DESCRIPTION

Figure 1:
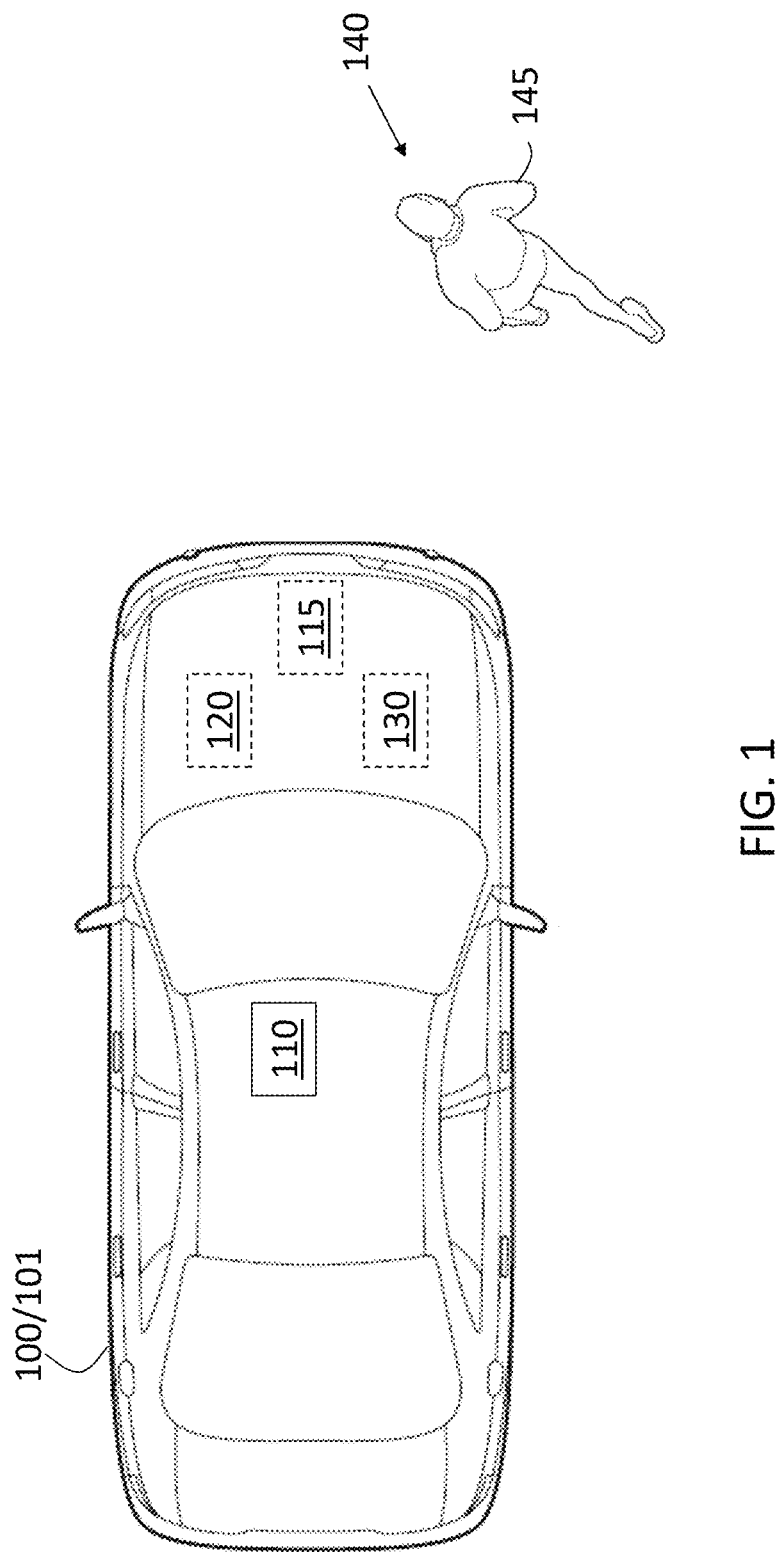
FIG. 1 is a block diagram of a scenario involving a chip-scale coherent lidar system according to one or more embodiments.

The following description is merely exemplary in nature and is not intended to limit the present disclosure, its application or uses. It should be understood that throughout the drawings, corresponding reference numerals indicate like or corresponding parts and features.

As previously noted, a mirror that collimates and directs light from the light emitting element on a photonic chip to a beam scanning device that emits the light from the lidar and a mirror that directs light from a beam scanning device and focuses it onto the light receiving element on a photonic chip have to be properly aligned with the respective beam scanning device and the respective element on the photonic chip. Embodiments of the methods and systems detailed herein relate to heterogeneous integration of a curved mirror structure for passive alignment in a chip-scale lidar. Heterogeneous integration refers to the assembly of separately manufactured components onto a single chip. According to one or more embodiments, curved mirrors are lithographically formed in a substrate to facilitate nanometer-level precision in the formation. According to embodiments detailed herein, the curved mirror structure that includes the substrate and curved mirrors is aligned and heterogeneously integrated with a photonic chip.

Specifically, alignment marks are used to precisely align and heterogeneously integrate the curved mirror structure with the photonic chip. By using the alignment marks, the curved mirrors and photonic chip are passively aligned such that closed loop control is not required to move the mirrors into alignment according to an active alignment procedure. The curved mirrors are also aligned with the beam steering devices, which are mirrors or other reflectors that may be actuated by a two-dimensional (2D) microelectromechanical system (MEMS).

Figure 2:
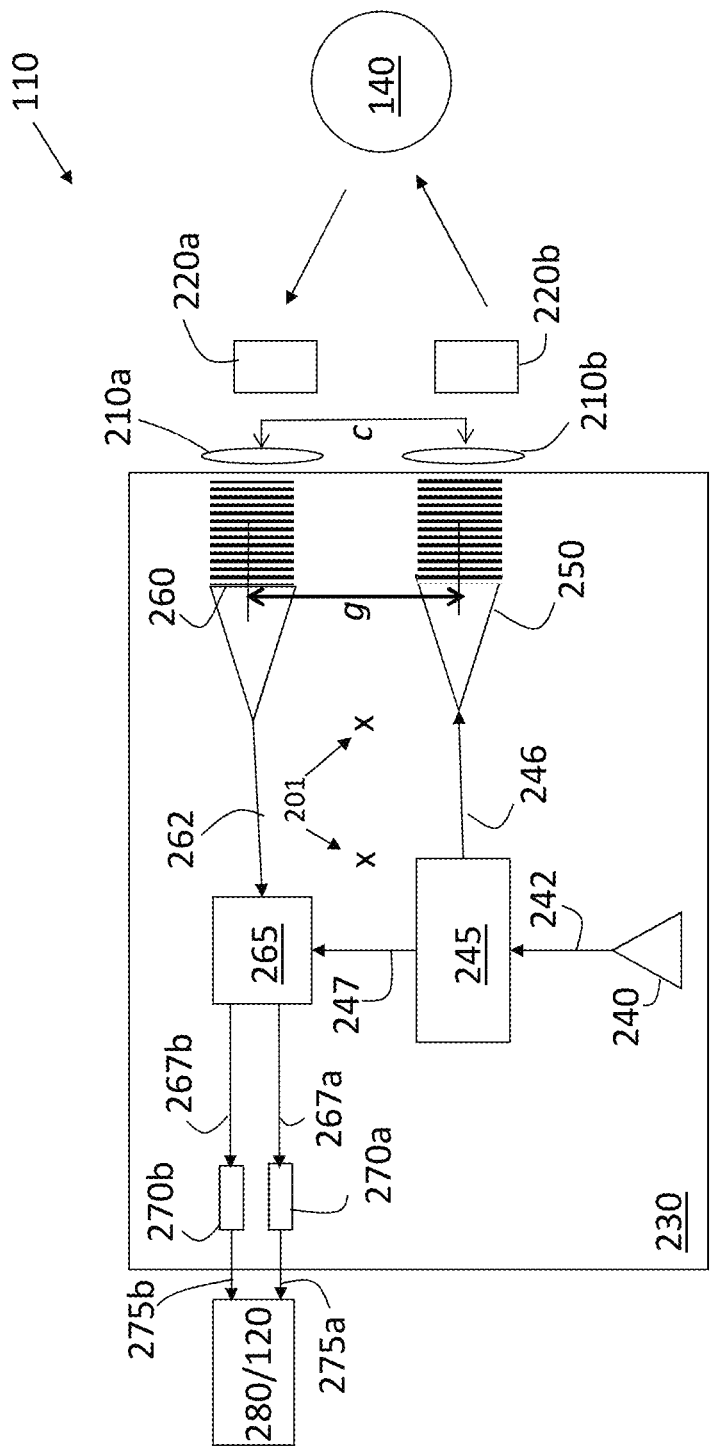
FIG. 2 is a block diagram of the lidar system with heterogeneously integrated curved mirrors according to one or more embodiments.

In accordance with an exemplary embodiment, FIG. 1 is a block diagram of a scenario involving a chip-scale coherent lidar system 110. The lidar system 110 includes heterogeneous integration of a curved mirror 210 (FIG. 2) with a photonic chip 230 (FIG. 2) for passive alignment as detailed with reference to FIGS. 3 and 4. The vehicle 100 shown in FIG. 1 is an automobile 101. A coherent lidar system 110, further detailed with reference to FIG. 2, is shown on the roof of the automobile 101. According to alternate or additional embodiments, one or more lidar systems 110 may be located elsewhere in or on the vehicle 100. Another sensor 115 (e.g., camera, sonar, radar system) is shown, as well. Information obtained by the lidar system 110 and one or more other sensors 115 may be provided to a controller 120 (e.g., electronic control unit (ECU)) for image or data processing, target recognition, and subsequent vehicle control.

The controller 120 may use the information to control one or more vehicle systems 130. In an exemplary embodiment, the vehicle 100 may be an autonomous vehicle and the controller 120 may perform known vehicle operational control using information from the lidar system 110 and other sources. In alternate embodiments, the controller 120 may augment vehicle operation using information from the lidar system 110 and other sources as part of a known system (e.g., collision avoidance system, adaptive cruise control system). The lidar system 110 and one or more other sensors 115 may be used to detect objects 140, such as the pedestrian 145 shown in FIG. 1. The controller 120 may include processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

FIG. 2 is a block diagram of the lidar system 110 with heterogeneously integrated curved mirrors 210a, 210b (generally referred to as 210) according to one or more embodiments. The center-to-center distance c between the curved mirrors 210a, 210b is indicated in FIG. 2 and further discussed with reference to FIG. 3. The alignment marks 201 are also further discussed with reference to FIG. 3. The exemplary lidar system 110 is a bistatic system that includes a separate path for transmission of light and for reception of reflected light from the target 140. That is, two separate beam steering devices, which are 2D MEMS mirrors 220a, 220b (generally referred to as 220) in the exemplary embodiment shown in FIG. 2, are used.

Photonic chip 230 includes a light source 240. The light source 240 may include components that are not on the photonic chip 230. For example, the light source 240 may be a laser diode that includes an oscillator on the photonic chip 230 and an off-chip current source, for example. Modulation of the current source results in a frequency modulated continuous wave (FMCW) signal 242 being output by the light source 240. The signal 242 is split, by a splitter 245, into the output signal 246 that is provided to transmit beam coupler 250 (e.g., grating or edge coupler) for transmission. The FMCW signal 242 is also split into the local oscillator (LO) signal 247. The output signal 246 is reflected by the curved mirror 210b to the 2D MEMS mirror 220b. As FIG. 2 indicates, the transmission from the 2D MEMS mirror 220b is scattered by the target 140. Some of that scattered reflection is received by the 2D MEMS mirror 220a and reflected off the curved mirror 210a to the receive beam coupler 260 (e.g., grating or edge coupler). The distance g between the transmit beam coupler 250 and the receive beam coupler 260 is indicated in FIG. 2 and further discussed with reference to FIG. 3.

The received signal 262 is combined with the LO signal 247 at the combiner 265 and then split into combined signal 267a and 267b (generally referred to as 267). Each combined signal 267 is provided to a photodetector 270a, 270b (generally referred to as 270). The received signal 262 and the LO signal 247 in each combined signal 267 interfere with each other in each photodetector 270. The photodetectors 270 convert the result of the interference into electrical currents 275a, 275b (generally referred to as 275) that are also referred to as beat signals. The two photodetectors 270 are used in accordance with a known balanced detector technique to cancel intensity noise in the LO signal 247 (which is caused by the light source 240 and, thus, is the same in the output signal 246 and the LO signal 247) that is common to both photodetectors 270. The electrical currents 275 from each of the photodetectors 270 are combined and processed to obtain three-dimensional information like range to the target 140 and the relative speed of the target 140 to the lidar system 110 as a function of two-dimensional spatial coordinates. The processing may be performed within the lidar system 110 by a processor 280 or outside the lidar system 110 by the controller 120, for example. The processor 280 may include processing circuitry similar to that discussed for the controller 120.

Figure 3:
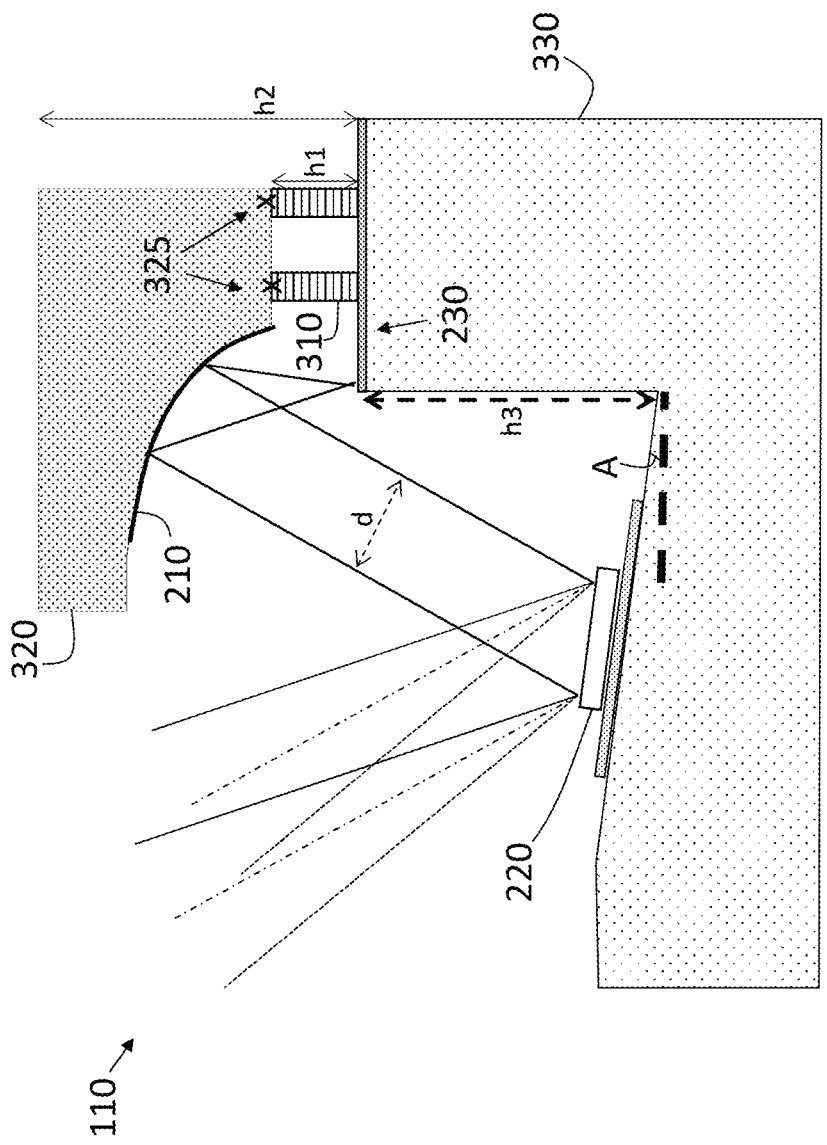
FIG. 3 depicts a side view of the lidar system that shows an exemplary arrangement of the heterogeneously integrated curved mirror according to one or more embodiments.

FIG. 3 depicts a side view of the lidar system 110 that shows an exemplary arrangement of the heterogeneously integrated curved mirror 210 according to one or more embodiments. FIG. 3 shows one curved mirror 210 and one 2D MEMS mirror 220 because a side view is depicted. A second curved mirror 210 and a corresponding second 2D MEMS mirror 220 are respectively disposed behind the visible curved mirror 210 and the visible 2D MEMS mirror 220 from the view shown in FIG. 3. In this case, the center-to-center distance c between the curved mirrors 210, which is indicated in FIG. 2, must match the distance g between the transmit beam grating coupler 250 and the receive beam grating coupler 260 shown on the photonic chip 230 in FIG. 2. As FIG. 3 indicates, the curved mirror 210 is formed in a substrate 320. The substrate 320 may include material that is thermally matched with the photonic chip 230. The substrate 320 is bonded to the photonic chip 230 by metal bonds 310 or other bonding material such as epoxy that are aligned with the alignment marks 201 on the photonic chip 230. The alignment is ensured by the alignment marks 325 on the substrate 320 in which the curved mirror 210 is formed.

The curved mirrors 210 are formed by lithographic techniques to facilitate precise dimensions and curvature. The precise curvature of the curved mirror 210b ensures collimation of the output signal 246 from the photonic chip 230 that is directed to the 2D MEMS mirror 220, and the precise curvature of the curved mirror 210a ensures focus of the received signal 262 from the 2D MEMS mirror 220 that is directed to the photonic chip 230. The curved mirrors 210 may be coated to enhance reflection. As FIG. 3 indicates, the photonic chip 230 and 2D MEMS mirrors 220 are formed in a packaging substrate 330.

According to an exemplary embodiment, a master curved mirror 210 may be formed using lithographic techniques such that subsequent curved mirrors 210 in subsequent lidar systems 110 may be formed using stamping based on the master. Alignment marks 201 on the photonic chip 230 facilitate precise alignment of the curved mirror 210 with the photonic chip 230. That is, the substrate 320 in which the curved mirrors 210 are formed is bonded with the photonic chip 230 using the alignment marks 201. When master curved mirrors 210 are formed, subsequent stamped curved mirrors 210 may still be precisely aligned with the photonic chip 230 based on the alignment marks 201. By using the alignment marks 201, the curved mirrors 210 and photonic chip 230 are passively aligned without the need for a closed loop control process of active alignment that involves moving the curved mirrors 210 until alignment is achieved.

As FIG. 3 indicates, the curved mirrors 210 are also passively aligned with the corresponding 2D MEMS mirrors 220. Correct alignment results in the center of the light beam directed by the transmit curved mirror 210b to be aligned to the center of the transmit 2D MEMS mirror 220b and the center of the light beam directed by the receive 2D MEMS mirror 220a to be aligned to the center of the receive curved mirror 210a. An exemplary, non-limiting width d of the beam being transmitted between the curved mirrors 210 and the 2D MEMS mirrors 220 is 2.3 millimeters (mm). Collimated light from the curved mirror 210b to the 2D MEMS mirror 220b is scattered out of the lidar system 110. Similarly, scattered reflected light directed from the 2D MEMS mirror 220a to the curved mirror 210a is collimated by the curved mirror 210a and provided to the photonic chip 230. As FIG. 3 indicates, the 2D MEMS mirrors 220 are non-parallel with the photonic chip 230. An exemplary angle A may be 12 degrees, and an exemplary height h3 may be 5.2 mm. An exemplary height h1 may be 1 mm, and h2 may be 4 mm. The dimensions provided are intended to be exemplary rather than limiting in any way.

FIG. 4 is a process flow of a method 400 of assembling a lidar system 110 with heterogeneously integrated curved mirrors 210 according to one or more embodiments. At block 410, designing two curved mirrors 210 involves considering several factors. As previously noted, the center-to-center distance c of the curved mirrors 210 is designed to be identical to the distance g between the transmit beam coupler 250 and the receive beam coupler 260 on the photonic chip 230. In addition, the three-dimensional curvature of the curved mirror 210 used in the transmission path is designed for appropriate beam diameter and divergence of the output signal 246, and the three-dimensional curvature of the curved mirror 210 used in the receive path is designed for appropriate focusing of the received signal 262 onto the receive beam grating coupler 260. Fabricating the curved mirrors 210 using three-dimensional lithography and etching, at block 420, ensures nanometer-level precision for the dimensions and curvature.

According to an exemplary embodiment, the lithographic techniques are only used for the master curved mirrors 210. According to this embodiment, at block 430, stamping curved mirrors 210 from the master is performed for every subsequent lidar system 110. At block 440, performing heterogeneous integration of the curved mirrors 210 with the photonic chip 230 includes using aligned thermo-compression (i.e., metal bonding) or adhesive bonding. The alignment marks 201 on the photonic chip 230 and alignment marks 325 on the substrate 320 are used to ensure proper passive alignment without the need for a closed loop control active alignment.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A chip-scale coherent lidar system, comprising:
a photonic chip that includes a light source, a transmit beam coupler configured to provide an output signal, and a receive beam coupler configured to receive a received signal based on a reflection of the output signal by a target;
a transmit beam steering device configured to transmit the output signal out of the system, wherein the transmit beam steering device is implemented as a two-dimensional microelectromechanical system (MEMS) mirror;
a receive beam steering device configured to obtain the received signal into the system, wherein the receive beam steering device is implemented as a two-dimensional MEMS mirror;
a transmit beam curved mirror configured to reflect the output signal from the transmit beam coupler to the transmit beam steering device; and
a receive beam curved mirror configured to reflect the received signal from the receive beam steering device to the receive beam coupler, wherein the transmit beam curved mirror and the receive beam curved mirror are formed in a substrate that is heterogeneously integrated with the photonic chip.

2. The lidar system according to claim 1, wherein the photonic chip includes alignment marks configured to facilitate passive alignment of the photonic chip with the substrate that includes the transmit beam curved mirror and the receive beam curved mirror.

3. The lidar system according to claim 1, wherein the light source is configured to output a frequency modulated continuous wave as the output signal.

4. The lidar system according to claim 1, wherein the photonic chip is formed on a packaging substrate.

5. The lidar system according to claim 4, wherein the transmit beam steering device and the receive beam steering device are also formed on the packaging substrate.

6. The lidar system according to claim 5, wherein the transmit beam steering device and the receive beam steering device are formed non-parallel to the photonic chip on the packaging substrate.

7. The lidar system according to claim 1, wherein a center-to-center distance between the transmit beam curved mirror and the receive beam curved mirror is a same as a distance between the transmit beam coupler and the receive beam coupler on the photonic chip.

8. The lidar system according to claim 1, wherein the transmit beam curved mirror is formed using lithographic techniques with a curvature configured to collimate the output signal from the transmit beam coupler, and the receive beam curved mirror is formed using lithographic techniques with a curvature configured to focus the received signal from the receive beam steering device onto the receive beam coupler of the photonic chip.

9. The lidar system according to claim 8, wherein a second transmit beam curved mirror is stamped based on a mold formed from the transmit beam curved mirror, and a second receive beam curved mirror is stamped based on a mold formed from the receive beam curved mirror.

10. The lidar system according to claim 1, wherein the lidar system is within or on a vehicle and is configured to detect a location and speed of an object relative to the vehicle.

11. A method of assembling a coherent lidar system, comprising:
forming a transmit curved mirror and a receive curved mirror side-by-side in a substrate as a curved mirror structure;
forming a photonic chip on a packaging substrate, the photonic chip including a light source, a transmit beam coupler configured to provide an output signal, and a receive beam coupler to receive a received signal based on a reflection of the output signal by a target; and
heterogeneously integrating the curved mirror structure with the photonic chip;
disposing a transmit beam steering device and a receive beam steering device side-by-side on the packaging substrate, wherein the transmit beam steering device and the receive beam steering device are each implemented as a two-dimensional microelectromechanical system (MEMS) mirror.

12. The method according to claim 11, wherein the disposing the transmit beam steering device and the receive beam steering device includes separating the transmit beam steering device and the receive beam steering device by a same distance as a center-to-center distance between the transmit curved mirror and the receive curved mirror.

13. The method according to claim 11, wherein the disposing the transmit beam steering device and the receive beam steering device is on a non-parallel plane with the photonic chip.

14. The method according to claim 11, wherein the heterogeneously integrating the curved mirror structure with the photonic chip includes using alignment marks on the photonic chip to passively align the curved mirror structure with the photonic chip.

15. The method according to claim 11, wherein the forming the transmit curved mirror and the receive curved mirror includes using photolithography and etching.

16. The method according to claim 15, further comprising forming a second transmit curved mirror and a second receive curved mirror includes stamping the second transmit curved mirror and the second receive curved mirror using molds formed respectively from the transmit curved mirror and the receive curved mirror.

17. A vehicle, comprising:
a coherent lidar system comprising:
- a photonic chip that includes a light source, a transmit beam coupler configured to provide an output signal, and a receive beam coupler configured to receive a received signal based on a reflection of the output signal by a target and focusing it onto a receive beam coupler on the photonic chip;
- a transmit beam steering device configured to transmit the output signal out of the system, wherein the transmit beam steering device is implemented as a two-dimensional microelectromechanical system (MEMS) mirror;
- a receive beam steering device configured to obtain the received signal into the system, wherein the receive beam steering device is implemented as a two-dimensional MEMS mirror;
- a transmit beam curved mirror configured to reflect the output signal from the transmit beam coupler to the transmit beam steering device; and
- a receive beam curved mirror configured to reflect the received signal from the receive beam steering device to the receive beam coupler, wherein the transmit beam curved mirror and the receive beam curved mirror are formed in a substrate that is heterogeneously integrated with the photonic chip; and
- a vehicle controller configured to use information from the lidar system to augment or automate vehicle systems.

18. The vehicle according to claim 17, wherein the transmit beam steering device and the receive beam steering device are formed non-parallel to the photonic chip on the packaging substrate.

19. The vehicle according to claim 17, wherein a center-to-center distance between the transmit beam curved mirror and the receive beam curved mirror is a same as a distance between the transmit beam coupler and the receive beam coupler on the photonic chip.

* * * * *